(12) United States Patent
Lee

(10) Patent No.: US 6,551,856 B1
(45) Date of Patent: Apr. 22, 2003

(54) METHOD FOR FORMING COPPER PAD REDISTRIBUTION AND DEVICE FORMED

(75) Inventor: Tze Liang Lee, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/637,223

(22) Filed: Aug. 11, 2000

(51) Int. Cl.⁷ .............................................. H01L 21/144
(52) U.S. Cl. ........................ 438/108; 257/747; 257/758; 257/762
(58) Field of Search ................ 438/108, 612, 438/613, 597, 638, 672, 674; 257/758, 747, 752, 762

(56) References Cited

U.S. PATENT DOCUMENTS 6,000,130 A  * 12/1999 Chang et al.
6,033,984 A  *  3/2000 Schnabel et al.
6,479,900 B1 * 11/2002 Shinogi et al. ............. 257/758

* cited by examiner

Primary Examiner—Long Pham
Assistant Examiner—Nathan W. Ha
(74) Attorney, Agent, or Firm—Tung & Associates

(57) ABSTRACT

A method for forming copper pad redistribution on a flip chip and structures formed by the method are disclosed. The method is compatible with a copper dual damascene process such that, after a substrate surface is planarized by chemical mechanical polishing, a single photomask can be used to pattern a plurality of redistribution pads, redistribution vias and redistribution lines. After the openings are filled with copper by an electroplating or an electroless plating technique, the top of the structure is again chemical mechanical polished to produce a planarized surface and resulting redistribution pads and redistribution lines. A sealing layer such as silicon nitride may be coated on the final structure as a moisture barrier.

12 Claims, 2 Drawing Sheets

METHOD FOR FORMING COPPER PAD REDISTRIBUTION AND DEVICE FORMED

FIELD OF THE INVENTION

The present invention generally relates to a method for forming input/output pad redistribution on a semiconductor substrate and device formed and more particularly, relates to a method for forming copper pad redistribution in a flip chip that is compatible with copper dual damascene process and a flip chip package formed.

BACKGROUND OF THE INVENTION

In the fabrication of IC devices, semiconductor chips are frequently attached to other chips or other electronic structures such as a printed circuit board. The attachment of the chip can be accomplished by a wire bonding process or by a flip chip attachment method. In a wire bonding process, each of a series of I/O bump terminal on a chip that is built on an aluminum bond pad is sequentially bonded to the connecting pads on a substrate. In a flip chip attachment method, all the I/O bumps on a semiconductor chip are terminated with a solder material. For instance, a frequently used solder material is a lead-rich, i.e., 97% lead/3% tin high melting temperature solder alloy. In the bonding process, a semiconductor chip is flipped over with the solder bumps aligned and placed in a reflow furnace to effect all the I/O connections to bonding pads on a substrate.

A major processing advantage made possible by the flip chip bonding process is its applicability to very high density I/O connections and its high reliability in the interconnects formed when compared to a wire bonding process. Moreover, the wire bonding process also has limitations in the total number of I/O interconnections that can be made in high performance devices.

A limiting factor for using the flip chip bonding process is the fine pitch bonding pads that are frequently required for wire bonding on modern high density devices. For instance, in a high density memory device, bonding pads that are arranged along the periphery of the device may have a pitch, or spacing, as small as 100 μm. At such narrow spacing, it is difficult and costly to accomplish bonding to the pads by using solder bumps in a flip chip bonding technique, taken into consideration that solder bumps in this case are of low profile, making underfill process extremely difficult. Moreover, a high density substrate which is very costly is required for flip chip bonding a device with a fine pitch I/O.

In order to bond high density IC devices that have peripheral I/O bonding pads with small pitch, i.e., in the range of approximately 100 μm, an I/O redistribution process must first be carried out before the formation of the solder bumps. In an I/O redistribution process, the peripheral I/O bonding pads are redistributed by signal traces to area array I/O bonding pads.

In a typical example, an IC chip that is equipped with peripheral I/O bonding pads has a pitch between the pads as small as 100 μm. Through an I/O redistribution process, a multiplicity of connecting traces are formed to redistribute the peripheral bonding pads to area array bonding pads. It should be noted that the pitch between the area array bonding pads are greatly increased, i.e., to the extent of approximately four times the pitch between the peripheral bonding pads. The significantly larger pitch between the area array bonding pads allows flip chip bonding to be connected on a low cost substrate manufactured by traditional process. The I/O redistribution process used on modern high density IC devices is therefore an important fabrication step to first enable the device to be solder bumped and then bonding to another chip or to a printed circuit board in a flip chip process. The formation of the connecting traces between the various pairs of bonding pads enables the I/O redistribution process to be accomplished.

More recently, void-free and seamless conductors are produced by electroplating copper from plating baths that contain a variety of additives. The capability of the electroplating method to superfill structural features without leaving voids or seams is unique and superior to that of other deposition techniques. Electrolytic copper plating techniques used in damascene structures can be defect-free if a seed layer deposited is continuous and has a uniform thickness. The copper seed layer is typically deposited by a physical vapor deposition technique over a barrier layer that prevents diffusion of copper into the insulator such as Ta or TaN.

A Cu dual damascene process consists of the formation of trenches and vias in a dielectric material, which stops at an etch-stop layer. The vias and trenches are then filled with a metal stack containing a barrier layer followed by Cu, and then removing the excess metal from the filled region typically by chemical mechanical polishing. This process can be used to form a single or a dual damascene structure. When Cu damascene interconnects are produced using plated Cu, typically a seed layer is sputtered on a barrier layer to improve the substrate conductivity and to allow for uniform Cu plating.

A conventional bond pad structure is shown in FIG. 1 for a wire bonding package. In this conventional structure, a dual layer passivation structure of an undoped silicate gas (USG) layer 12 and a silicon nitride layer 14 is first deposited on a copper bond pad 20. An opening is then formed in the passivation layers 12, 14 for an aluminum/copper pad 18. Several processing drawbacks are associated with this bond pad forming process, for instance, an additional 1~2 photomasking processing are required, a copper oxidation problem, and a large flat silicon nitride passivation layer which presents peeling problem due to built-in stress.

FIG. 2 illustrates a conventional method for wire redistribution in a flip tip package 30. In the flip chip 30, aluminum bond pad 16 is first formed on a silicon substrate 22. After an oxide passivation layer 24 and a polyimid layer 26 are deposited on top of the aluminum bond pad 16, an opening is formed for aluminum sputtering a redistribution layer, a second polyimide dielectric layer 32 is then deposited to insulate the aluminum wiring 28. At an opposite end of the aluminum wiring 28, an opening is formed for depositing an under-bump-metallurgy layer 34, and a solder bump for forming solder ball 36 after a reflow process. In this conventional aluminum pad redistribution process for the flip chip package 30, after the formation of the aluminum pad 16 and the deposition of the polyimide layer 26, a first photomasking step is required such that etching can be carried out for forming the opening in the polyimide. After aluminum is sputtered for the aluminum wiring 28 for redistribution, a second photomasking step and subsequent etching are carried out to define the aluminum wiring. After a second polyimide layer 32 is deposited on top of the package 30, a third photomasking and etching steps are required for the opening in polyimide layer 32 and for the growth of UBM layer 34. The conventional aluminum pad redistribution process for the flip chip package therefore requires additional three photomasking steps which presents a major disadvantage for the process. While the process has been used and is compatible with aluminum process, there has been no pad redistribution process proposed that is compatible with a copper dual damascene process for forming pad redistribution. Since wet etching of copper is not possible, copper cannot be used to easily replace aluminum in a typical aluminum process which requires wet etching to define the redistribution.

It is therefore an object of the present invention to provide a flip chip pad redistribution process that does not have the drawbacks or shortcomings of the conventional pad redistribution process for aluminum.

It is another object of the present invention to provide a flip chip pad redistribution process that is compatible with a copper dual damascene process.

It is a further object of the present invention to provide a flip chip pad redistribution process wherein a redistribution pattern and a passivation pattern can be carried out on the same photomask.

It is still another object of the present invention to provide a flip chip pad redistribution process which only requires a single photomasking step for forming redistribution vias, redistribution lines and redistribution pads in a single photomasking process.

It is still another object of the present invention to provide a flip chip pad redistribution process utilizing chemical mechanical polishing for defining the structural features instead of by wet etching.

It is yet another object of the present invention to provide a flip chip pad redistribution process that can be used advantageously in a copper dual damascene process.

It is still another further object of the present invention to provide a flip chip package that incorporates copper pad redistribution therein by forming copper redistribution lines for providing electrical communication between copper redistribution pads and copper redistribution vias.

It is yet another further object of the present invention to provide a flip chip package that incorporates copper pad redistribution therein wherein the package is equipped with a plurality of solder balls formed on a plurality of copper redistribution pads.

SUMMARY OF THE INVENTION

In accordance with the present invention, a method for forming copper pad redistribution can be carried out by the operating steps of first providing a pre-processed semiconductor substrate that has a first plurality of copper bond pads in a top surface, planarizing the semiconductor substrate by chemical mechanical polishing, forming a passivation layer on a planarized top surface of the semiconductor substrate, patterning and etching the passivation layer openings for a first plurality of redistribution vias, a second plurality of redistribution lines connecting the first plurality of redistribution vias and the first plurality of redistribution pads by a dry etching method wherein sidewall passivation forms in openings of the second plurality of redistribution lines stopping etching in the passivation layer ids while openings for the redistribution vias are etched through the passivation layer to expose surfaces of the first plurality of copper bond pads, depositing copper into the openings for the first plurality of redistribution vias, the first plurality of redistribution pads and the second plurality of redistribution lines, and planarizing the semiconductor substrate forming the first plurality of redistribution pads and the second plurality of redistribution lines.

The method for forming copper pad redistribution may further include the step of forming the first plurality of copper bond pads in an inter-metal-dielectric (IMTI) layer formed on the top surface of the semiconductor substrate, or the step of forming the passivation layer in two separate layers of a first passivation layer on top of the first plurality of copper bond pads and a second passivation layer on top of the first passivation layer. The first passivation layer may be silicon oxide, while the second passivation layer may be silicon nitride. The method may further include the step of etching openings in the passivation layer for the first plurality of redistribution vias to a depth larger than the openings etched for the second plurality of redistribution lines. The method may further include the step of etching openings for the second plurality of redistribution lines in the passivation layer. The method may further include the step of stopping the etching of openings for the second plurality of redistribution lines by polymer sidewall passivation in the openings. The method may further include the step of stopping the etching of openings for the second plurality of redistribution lines in a sub-layer of silicon oxide in the passivation layer. The method may further include the step of planarizing the semiconductor substrate after the copper deposition process by chemical mechanical polishing. The method may further include the step of depositing copper into the openings for the first plurality of redistribution pads, the first plurality of redistribution vias and the second plurality of redistribution lines by an electroplating or an electroless plating technique. The method may further include the step of depositing a sealing layer of an insulating material on top of the semiconductor substrate over the first plurality of redistribution pads and the second plurality of redistribution lines. The sealing layer may be deposited of silicon nitride.

The present invention is further directed to a flip chip package incorporating copper pad redistribution therein including a semiconductor substrate that has an active circuit formed thereon, a first plurality of copper bond pads imbedded in an insulating layer on top of the semiconductor substrate for electrical communication with the active circuit, a passivation layer formed on top of the first plurality of copper bond pads and the insulating layer, a first plurality of copper redistribution vias formed in the passivation layer for electrical communication with the first plurality of copper bond pads, a first plurality of copper redistribution pads formed in the passivation layer each having a top surface exposed, a second plurality of copper redistribution lines formed in the passivation layer for providing electrical communication between the first plurality of copper redistribution vias and the first plurality of copper redistribution pads, and a sealing layer formed of an insulating material covering the first plurality of copper redistribution vias, the second plurality of copper redistribution lines and the passivation layer while exposing the first plurality of copper redistribution pads.

The flip chip package incorporating copper pad redistribution therein may further include a first plurality of solder bumps formed on and in electrical communication with the first plurality of copper redistribution pads. The flip chip package may further include a first plurality of solder balls formed on the first plurality of copper redistribution pads. The insulating layer may be an inter-metal dielectric layer. The passivation layer may further include a layer of silicon oxide contacting the insulating layer and a layer of silicon nitride on top of the silicon oxide layer. The sealing layer may be formed of silicon nitride.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
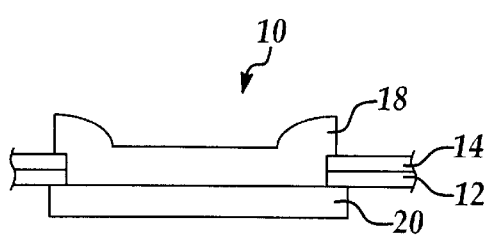
FIG. 1 is an enlarged, cross-section view of a conventional bond pad structure for wire bonding.
Figure 2:
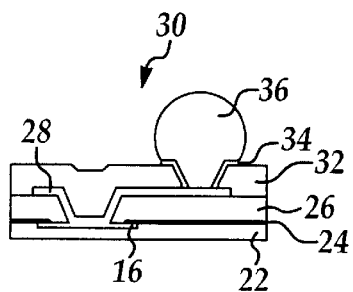
FIG. 2 is an enlarged, cross-sectional view of a conventional flip chip package with aluminum redistribution.

The present invention discloses a method for forming copper pad redistribution in a flip chip that is compatible with a copper dual damascene process and a flip chip package incorporating the copper pad redistribution.

A key advantage of the present invention novel method is its compatibility with a copper dual damascene process in which copper vias and lines are formed. In the process, a dual passivation layer of silicon oxide and silicon nitride is first deposited on a wafer surface after the wafer surface is planarized by a chemical mechanical polishing method. In addition to the copper redistribution pads, copper redistribution lines are also patterned simultaneously. A suitable dimension for the redistribution pad and the redistribution line is 120 nm and 10 nm, respectively. The present invention novel method further utilizes an etching recipe that provides heavy polymer protection. The etching process of the redistribution lines with small dimensions will automatically stop due to polymer passivation on the sidewall of the lines. Redistribution pads, on the other hand, will be etched directly down to the top of the copper bond pads due to the relative wide dimension. By properly controlling the etching recipe and the passivation layer (i.e., the silicon nitride layer) thickness, the present invention novel structure can be achieved.

In the present invention novel method, a chemical mechanical method has been advantageously utilized to form the redistribution pad after the copper barrier and the copper electro-deposition process. A sealing layer of an insulating material, i.e., of silicon nitride may be deposited on top of copper to prevent a direct contact of copper with a subsequently deposited passivation layer of polyimide.

The present invention novel method not only solves the issue of flip chip redistribution but also provides a simplified process compared to the conventional aluminum redistribution process. A further advantage provided by the present invention novel method is the relief of the passivation stress. Due to the nature of the copper dual damascene process, the passivation layer is a large, flat sheet covering the entire wafer. Under such circumstances, it is likely for the flat sheet to peel off due to a high stress in the passivation layer. The present invention copper redistribution line embedded in the passivation layer releases the stress and thus preventing peeling.

Still another added advantage provided by the present invention novel method is a practical solution for heat distribution, i.e., providing a heat sink in a copper low-k process. In a semiconductor device that has reduced dimensions, the back end performance presents a bottle neck for the process. Copper with low resistivity and low-K materials with low coupling capacitance can be adapted to improve the performance. The present invention novel method demonstrates that the clock frequency is expected to be as high as 1 GHz at 0.13 nm node. A penalty for using the low-k materials is the heat dissipation problem due to their poor thermal productivity. The present invention novel method provides a heat sink anchor which resolves the problem and avoids property degradation due to temperature increase.

Figure 3A:
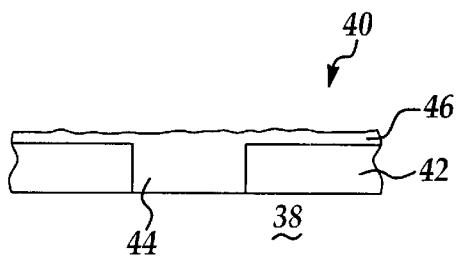
FIG. 3A is an enlarged, cross-sectional view of the present invention copper pad redistribution structure illustrating a copper bond pad opening filled with copper.
Figure 3B:
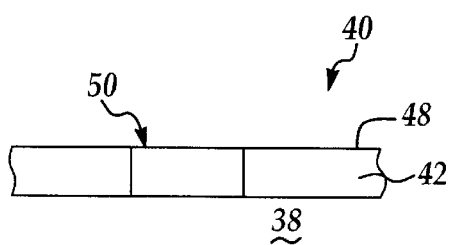
FIG. 3B is an enlarged, cross-sectional view of the present invention structure of FIG. 3A after planarized by a chemical mechanical polishing method.
Figure 3C:
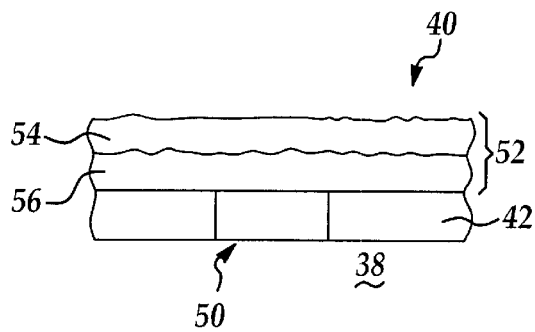
FIG. 3C is an enlarged, cross-sectional view of the present invention structure of FIG. 3B after dual passivation layers of silicon oxide and silicon nitride are deposited.

Referring now to FIG. 3A wherein a present invention structure 40 is shown. In structure 40, an inter-metal-dielectric layer 42 is first deposited on an electronic substrate 38 that contains a pre-processed active circuit therein (not shown). A bond pad opening 44 is formed in the IMD layer 42 and filled with copper 46. The semiconductor 40 is then planarized to produce a flat top surface 48, as shown in FIG. 3B, by a chemical mechanical polishing method producing a copper bond pad 50. On top of the planarized surface 48, is then deposited a passivation layer 52 which may consist of two separate layers, i.e., a silicon oxide layer 56 and a silicon nitride layer 54. This is shown in FIG. 3C.

Figure 3D:
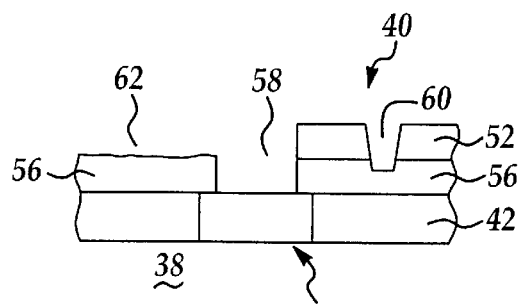
FIG. 3D is an enlarged, cross-sectional view of the present invention structure of FIG. 3C after redistribution vias and redistribution lines are patterned.

In the next step of the process, a photomasking process is performed followed by a reactive ion etching (RIE) process for etching the passivation layer 52 and forming an opening for a redistribution via 58 and openings for redistribution lines 60, 62. This step illustrates a present invention novel feature in that the redistribution pattern and the passivation pattern are formed on the same photomask. This is shown in FIG. 3D. The reactive ion etching of the passivation layer 52 can be carried out by utilizing etchants such as $CCl_2F_2$, $CHF_3/CF_4$, $CHF_3/O_2$, $CH_3CHF_2$ for silicon oxide, and etchants such as $CF_4/O_2$, $CF_4/H_2$, $CHF_3$ and $CH_3CHF_2$ for silicon nitride.

Figure 3E:
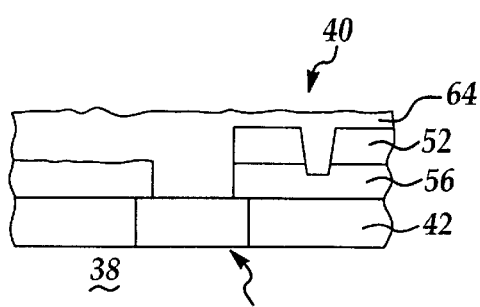
FIG. 3E is an enlarged, cross-sectional view of the present invention structure of FIG. 3D after copper is electrodeposited into the structure.
Figure 3F:
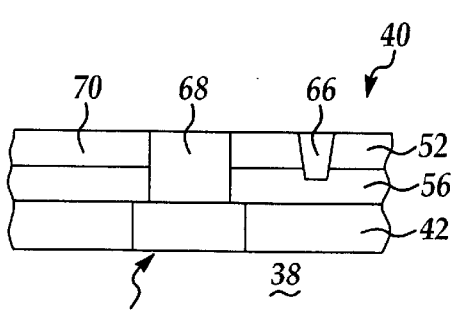
FIG. 3F is an enlarged, cross-sectional view of the present invention structure of FIG. 3E after planarized by a chemical mechanical polishing method.
Figure 3G:
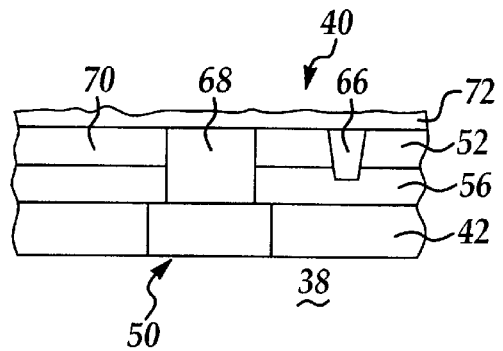
FIG. 3G is an enlarged, cross-sectional view of the present invention structure of FIG. 3F after a sealing layer is deposited on top.

In the next step of the present invention novel method, as shown in FIG. 3E, copper 64 is blanket deposited on top of the present invention structure 40 by a technique such as electroplating or electroless plating. It should be noted that copper 64 fills up opening 60 for the redistribution line, opening 58 for the redistribution via and opening 52 for the redistribution line. A chemical mechanical polishing method is then carried out on the present invention structure 40 to produce a redistribution line 66, a redistribution via 68 and a redistribution line 70, as shown in FIG. 3F. In the last step of the process, shown in FIG. 3G, a sealing layer 72 of an insulating material, such as silicon nitride as a for moisture barrier is deposited on top of structure 40 to provide the sealing function. It should be noted that, through FIGS. 3A~3G, the formation of a redistribution pad with its top surface exposed through the sealing layer 72 is not shown due to the fact that the pad is situated away from the copper bond pad 50.

Figure 4:
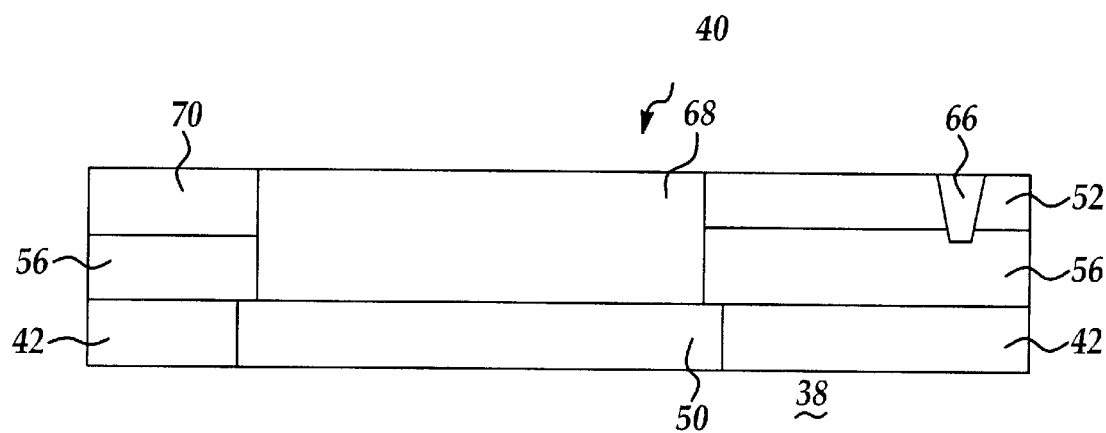
FIG. 4 is an enlarged, cross-sectional view of a present invention copper pad redistribution structure.
Figure 5:
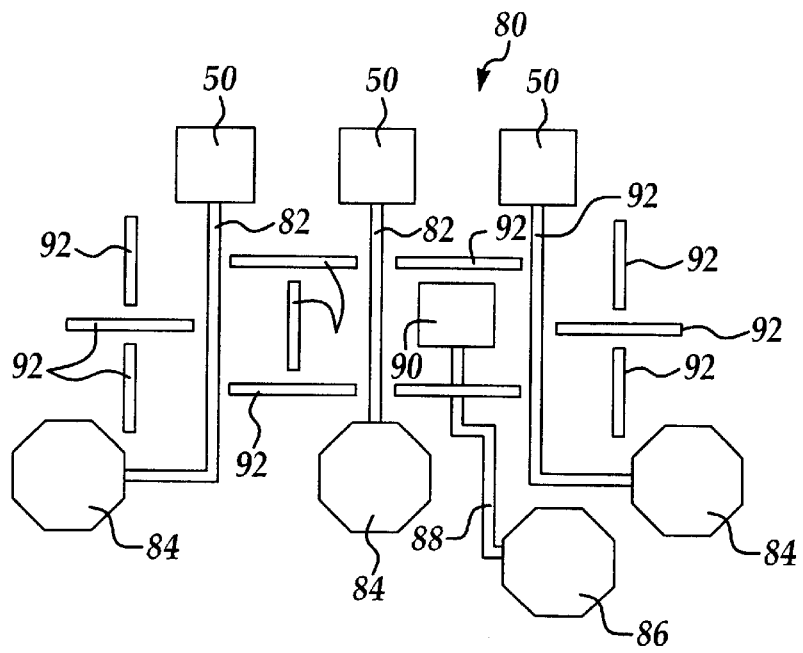
FIG. 5 is an enlarged, plane view of the present invention redistribution vias, redistribution pads and redistribution lines.

FIG. 4 illustrates an enlarged, cross-sectional view of the present intention structure, similar to that shown in FIG. 3F. An enlarged, plane view of a typical redistribution scheme 80 is shown in FIG. 5. It is seen in FIG. 5 that, a plurality of bond pads 50 are formed, presumably at a center portion of an IC chip, i.e., a flip chip. On top of the bond pads 50, a plurality of redistribution vias (not shown) are formed for connection to redistribution lines 82. At the opposite end of the redistribution line 82, is formed a copper redistribution pad or bump pad 84. Also shown in FIG. 5, is a heat sink 86 or anchor bump for connecting through a redistribution line 88 to a heat sink 90, or a dummy pad. Passivation stress relief slots 92 are further provided for stress relief of the passivation layer on top of the copper structure.

In the final step of the present invention process, which is not shown in FIG. 5, solder bumps are formed by an electroplating or an electroless plating technique on top of the bump pads 84. The solder bumps may be subsequently reflown at a temperature higher than the melting temperature of the solder material to form a plurality of solder balls on top of the bump pads 84.

The present invention novel method for forming copper pad redistribution on a flip chip that is compatible with a copper dual damascene process and the flip chip formed have therefore been amply described in the above description and in the appended drawings of FIGS. 3A–5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming copper pad redistribution comprising the steps of:

providing a pre-processed semiconductor substrate having a first plurality of copper bond pads in a top surface, planarizing said semiconductor substrate by chemical mechanical polishing, forming a passivation layer on said planarized top surface of the semiconductor substrate, patterning and etching said passivation layer openings for a first plurality of redistribution vias, a first plurality of redistribution pads and a second plurality of redistribution lines connecting said first plurality of redistribution vias and said first plurality of redistribution pads by a dry etching method wherein sidewall passivation forms in openings of said plurality of redistribution lines stopping said etching in said passivation layer while opening for said first plurality of redistribution vias are etched through in said passivation layer to expose surfaces of said first plurality of copper bond pads, depositing copper into said openings for said first plurality of redistribution vias, said first plurality of redistribution pads and said second plurality of redistribution lines, and planarizing said semiconductor substrate forming said first plurality of redistribution vias and said second plurality of redistribution lines.

2. A method for forming copper pad redistribution according to claim 1 further comprising the step of forming said first plurality of copper bond pads in an inter-metal-dielectric layer formed on said top surface of the semiconductor substrate.

3. A method, for forming copper pad redistribution according to claim 1 further comprising the step of forming said passivation layer in two separate layers of a first passivation layer on top of said first plurality of copper bond pad and a second passivation layer on top of said first passivation layer.

4. A method for forming copper pad redistribution according to claim 3, wherein said first passivation layer is silicon oxide and said second passivation layer is silicon nitride.

5. A method for forming copper pad redistribution according to claim 1 further comprising the step of etching said openings in said passivation layer for said first plurality of redistribution vias to a depth larger than said openings etched for said second plurality of redistribution lines.

6. A method for forming copper pad redistribution according to claim 1 further comprising the step of stopping said etching of openings for said second plurality of redistribution lines in said passivation layer.

7. A method for forming copper pad redistribution according to claim 1 further comprising the step of stopping said etching of openings for said second plurality of redistribution lines by polymer sidewall passivation in said openings.

8. A method for forming copper pad redistribution according to claim 1 further comprising the step of stopping said etching of openings for said second plurality of lines in a sub-layer of silicon oxide in said passivation layer.

9. A method for forming copper pad redistribution according to claim 1 further comprising the step of planarizing said semiconductor substrate after said copper deposition process by chemical mechanical polishing.

10. A method for forming copper pad redistribution according to claim 1 further comprising the step of depositing copper into said openings for said first plurality of redistribution pads, said first plurality of redistribution vias and said second plurality of redistribution lines by an electroplating or an electroless plating technique.

11. A method for forming copper pad redistribution according to claim 1 further comprising the step of depositing a sealing layer of an insulating material on top of said semiconductor substrate over said first plurality of redistribution pads and said second plurality of redistribution lines.

12. A method for forming copper pad redistribution according to claim 11, wherein said sealing layer is deposited of silicon nitride.

* * * * *